United States Patent [19]

Kirtley et al.

[11] Patent Number: 5,786,690
[45] Date of Patent: Jul. 28, 1998

[54] HIGH RESOLUTION THREE-AXIS SCANNING SQUID MICROSCOPE HAVING PLANAR SOLENOIDS

[75] Inventors: John Robert Kirtley, Katonah, N.Y.; Mark Benjamin Ketchen, Hadley, Mass.

[73] Assignee: International Business Machines Corporation, Armonk, N.Y.

[21] Appl. No.: 292,641

[22] Filed: Aug. 18, 1994

[51] Int. Cl.$^6$ .................. G01R 33/035; H01L 39/22
[52] U.S. Cl. .................. 324/248; 324/247; 336/232; 505/846
[58] Field of Search .................. 324/249, 248, 324/253, 247, 244, 260, 261, 254, 255, 258; 505/846, 845; 336/200, 232

[56] References Cited

U.S. PATENT DOCUMENTS

| | | | |
|---|---|---|---|
| 3,848,210 | 11/1974 | Felkner | 336/206 |
| 4,267,510 | 5/1981 | Convertini et al. | 324/249 |
| 4,887,033 | 12/1989 | Langdon et al. | 324/253 |
| 4,982,157 | 1/1991 | Siefert | 324/248 |
| 5,122,744 | 6/1992 | Koch | 324/248 |
| 5,142,229 | 8/1992 | Marsden | 324/248 |
| 5,276,396 | 1/1994 | Seitz | 324/253 |
| 5,289,121 | 2/1994 | Kajola et al. | 324/248 |

OTHER PUBLICATIONS

"SQUIDS (for superconducting quantum interference devices) . . . " Scientific American, Aug. 1994 pp. 46–53 J. Clarke.

"Integrated Thin-Fi,s dc SQUID Sensors" M. B. Ketchen IEEE Trans. on Magnetics vol.Mag–23 #2 Mar. 1987 pp.1650–1657.

"Sub–µm, planarized, Nb–AlO$_{x-Nb}$ Josephson process for 125 mm . . . " M.B Ketchen et al Appl.Phys. Lett 59 (20) Nov. 11, 1991 pp. 2609–2611.

"Integrated Thin–Film Miniature SQUID Magnetometer" IBM Tech. Disc. Bulletin vol. 27 #10A Mar. 1985 S. Bermon et al pp. 5847–5848.

*Primary Examiner*—Walter E. Snow
*Attorney, Agent, or Firm*—Stephen S. Strunck

[57] ABSTRACT

The present invention provides a miniature three-axis instrument for measuring the actual magnetic field vector. The novel instrument of the invention has three magnetometers on a single chip configured such that their pickup elements are coplanar, colinear and in fairly close proximity to each other. The tip of the chip, with the three pickup elements, is fashioned to allow as close an approach to the surface to be scanned as is possible with current single magnetometer scanning microscopes. The different positions of the pickup elements on the chip is compensated for digitally after data acquisition. The z-axis magnetometer has a planar pickup coil structure as is known in the art while the x-axis and y-axis sensing elements have a novel multi-turn, thin-film structure in the form of a planar solenoid which is another novel aspect of the present invention.

6 Claims, 7 Drawing Sheets

HIGH RESOLUTION THREE-AXIS SCANNING SQUID MICROSCOPE HAVING PLANAR SOLENOIDS

BACKGROUND OF THE INVENTION

The present invention relates generally to superconducting quantum interference devices (SQUIDs) and more particularly to a high resolution, three-axis scanning magnetometer integrated onto a single planar substrate.

Figure 1:
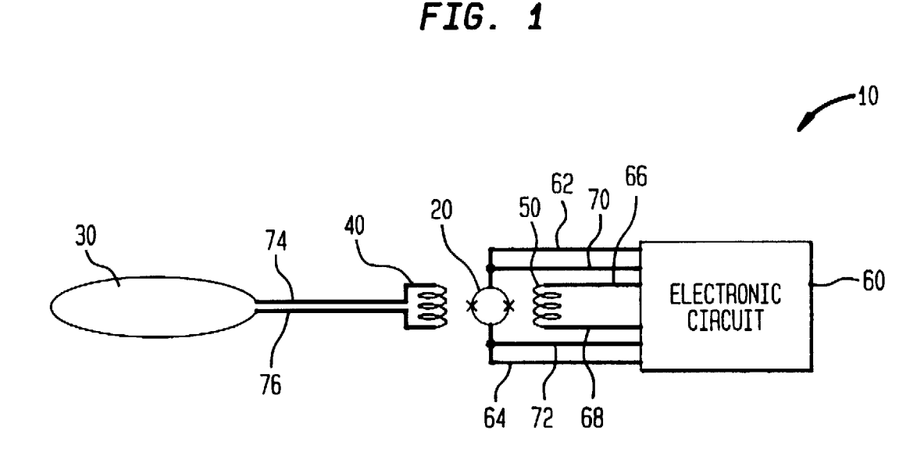
FIG. 1 illustrates a typical prior art dc SQUID sensing device.

A typical dc SQUID sensing device 10 is shown schematically in FIG. 1. The device generally consists of a superconducting element (or SQUID ring) 20 of inductance Li interrupted by at least one Josephson element (x). Pickup (sensing) coil 30 having an inductance L2 is inductively coupled to element 20 through input coil 40. Electronic circuitry 60 supplies element 20 with dc bias through lines 62, 64 while feedback modulation via lines 66, 68 is inductively coupled from coil 50 to element 20.

Magnetic flux can be coupled to element 20 either by application of an external magnetic field or by passing a current through input coil 40. A signal indicative of the applied external magnetic field is transmitted to circuitry 60 over lines 70, 72 and processed by circuitry 60.

In most cases the Josephson elements are Josephson tunnel junctions as described by J. Clarke in an article in Scientific American, vol. 271, No. 2, pp. 46–53 (August 1994), which article is herein incorporated by reference. SQUID sensors, such as that of FIG. 1, can include element 20 and integrated coils 40 and 50 fabricated in thin-film form by planar technology which can incorporate fully integrated pickup element structures as well. The magnetic and electrical characteristics of dc SQUIDS are well known and described in the art as in the paper by M. Ketchen in IEEE Transactions on Magnetics, Vol. MAG-23, No. 2, March 1987, which article is incorporated herein by reference.

In the case of a scanning SQUID microscope, sensing coil 30 is made as small as possible and is generally and relatively located remote from the rest of the structures with its signal transmitted via transmission lines 74, 76 which are typically of a superconducting material.

Previous proposed and implemented scanning SQUID microscopes (scanning magnetometers) have all measured only a single component of the magnetic field. By making an assembly with three orthogonally oriented miniature magnetometers, one could, in principle, make a three-axis instrument for measuring the actual magnetic field vector. This would give much more information than the simple one-component measurement system, but such an assembly would be very difficult to implement. It would be far better if one could integrate all three axes on a single planar substrate. However, heretofore, it has not been possible to fabricate a planar assembly of three miniature magnetometers having the capability of sensing all three axes with comparable sensitivity.

SUMMARY OF THE INVENTION

The present invention provides a miniature three-axis instrument for measuring the actual magnetic field vector. The novel instrument of the invention has three magnetometers on a single chip configured such that their pickup elements are coplanar, colinear and in fairly close proximity to each other. The tip of the chip, with the three pickup elements, is fashioned to allow as close an approach to the surface to be scanned as is possible with current single magnetometer scanning microscopes. The different positions of the pickup elements on the chip is compensated for digitally after data acquisition. The z-axis magnetometer has a planar pickup coil structure as is known in the art while the x-axis and y-axis sensing coils have a novel multi-turn, thin-film structure in the form of a planar solenoid which is another novel aspect of the present invention.

BRIEF DESCRIPTION OF THE DRAWINGS

Other features and advantages of the present invention will be apparent from the following description taken in connection with the accompanying drawings, wherein.

DETAILED DESCRIPTION OF THE INVENTION

Figure 2:
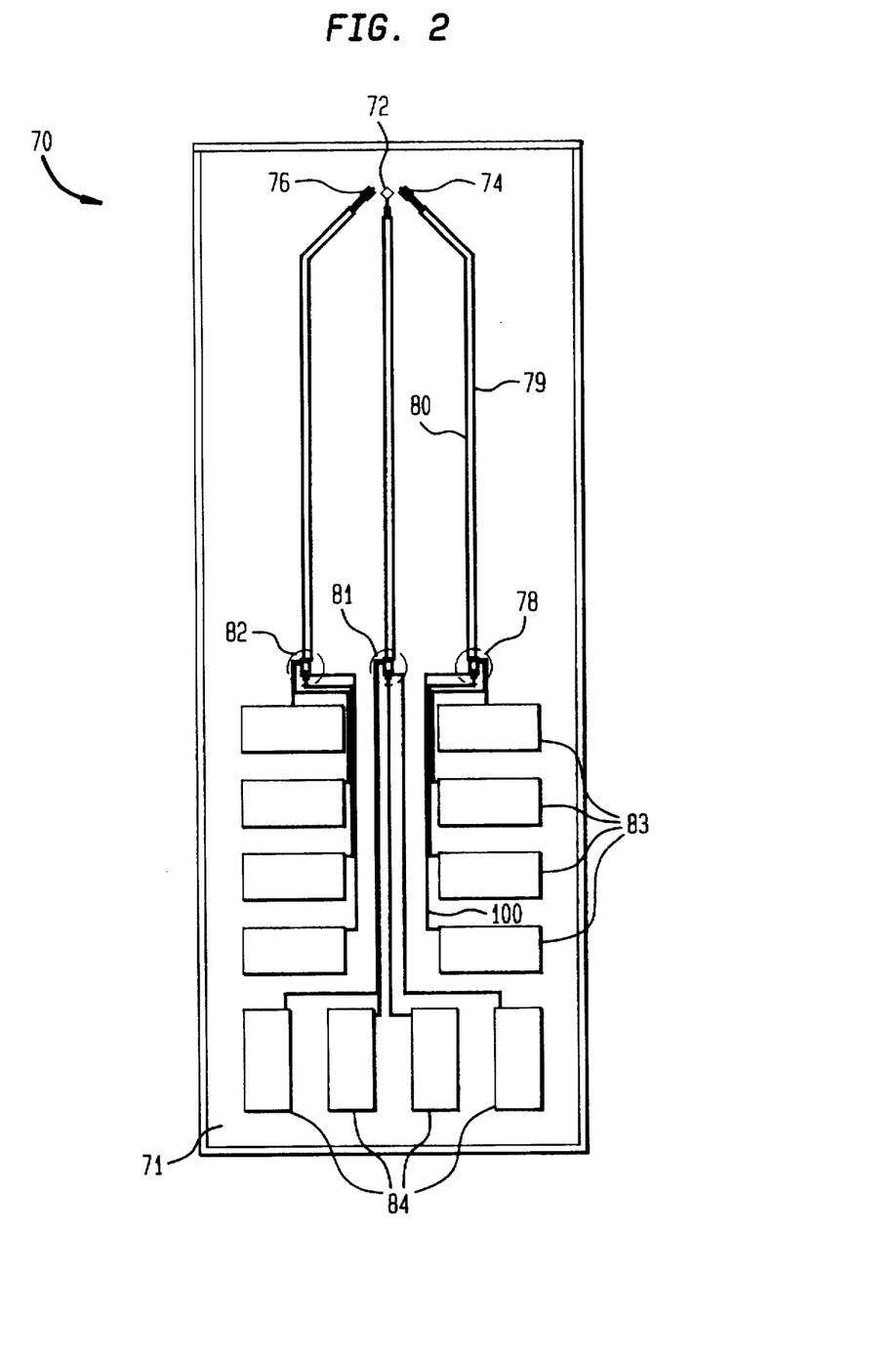
FIG. 2 is a plan view of an exemplary embodiment of a high resolution, three-axis scanning miniature SQUID magnetometer (microscope) of the present invention.

In FIG. 2 there is illustrated, in plan view form, an exemplary three-axis scanning magnetometer 70 of the present invention. The elements of magnetometer 70 are fabricated on a single substrate 71 which may be made of any non-magnetic material, typically, and in this embodiment, a single crystalline silicon wafer. Miniature sensing elements 72, 74 and 76 are shown in a first region of substrate 71. Miniature sensing element 72 is of the planar, thin-film loop type typically used in a single magnetometer scanning microscope device of the prior art as is described by Bermon, et al., in IBM Technical Disclosure Bulletin vol. 27, No. 10A (March 1985), which Bulletin is herein incorporated by reference. In the device of the present invention, coil 72 is used to sense magnetic fields in the z-direction (the z direction being perpendicular to the plane of FIG. 2).

Figure 3:
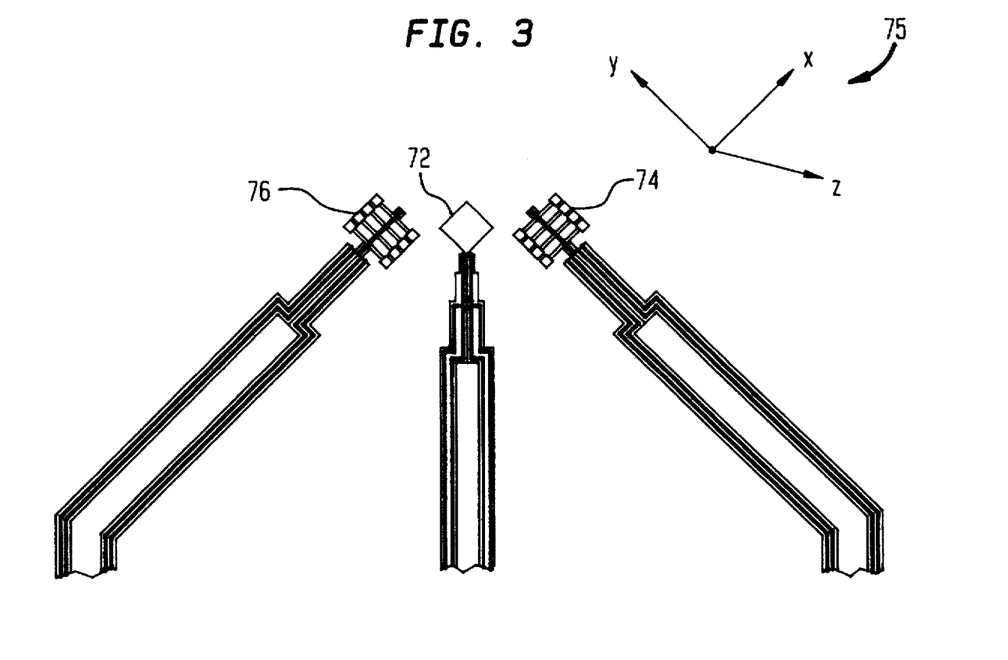
FIG. 3 is an enlarged plan view of the pickup elements at the tip region of the microscope of FIG. 2.

At 74 and 76 there are shown, in greater detail in FIG. 3, novel multi-turn, thin-film miniature pickup elements of the present invention. Element 76 senses the magnetic field in the x-direction ($B_x$) while element 74 senses the magnetic field in the y-direction ($B_y$) as indicated by the arrow diagram at 75.

At 78, at a second region of substrate 71, there is located the SQUID, input coil and feedback coil associated with element 74 which, while not shown in detail, are similar to those of FIG. 1. Alternatively, pickup element 74 may be directly coupled ("hard wired") to the SQUID's inductive loop or the configuration may be such that there is one continuous electrical path through the junction(s) and the pickup element whereby part of the SQUID's inductive loop is formed by the pickup element. Signals from element 74 are transmitted along low inductance stripline transmission lines 79, 80 to the SQUID at location 78. Lines 79, 80 are typically made of a superconducting material such as niobium. Similar structures 81, 82 to those associated with 78 are located adjacent to 78 to perform like functions in connection with elements 72 and 76, respectively. Connection pads for supplying the bias and modulation to magnetometer 74 and for feeding out the signals received by magnetometer 78 are located at 83. Similar connection pads 84 and 85 are associated with magnetometers 72 and 76, respectively. Elements 72, 74, and 76 and all of the structures associated with them are located on substrate 71.

It should be understood that the same basic pickup element arrangement at the first region of substrate 71 need not be connected to the SQUID structures within regions 78, 81 and 82. For example, the SQUID structures could be replaced by detection devices such as Field Effect Transistors (FETs) or bi-polar transistors whereby the instrument would then be sensitive to the time dependence ($d\vec{B}/dt$) of the magnetic field vector. In this case, it is not necessary that the pickup elements and lead structures be fabricated of superconducting materials; they could, for example, be constructed of aluminum or copper and the instrument could be operated at room temperature.

Figure 4:
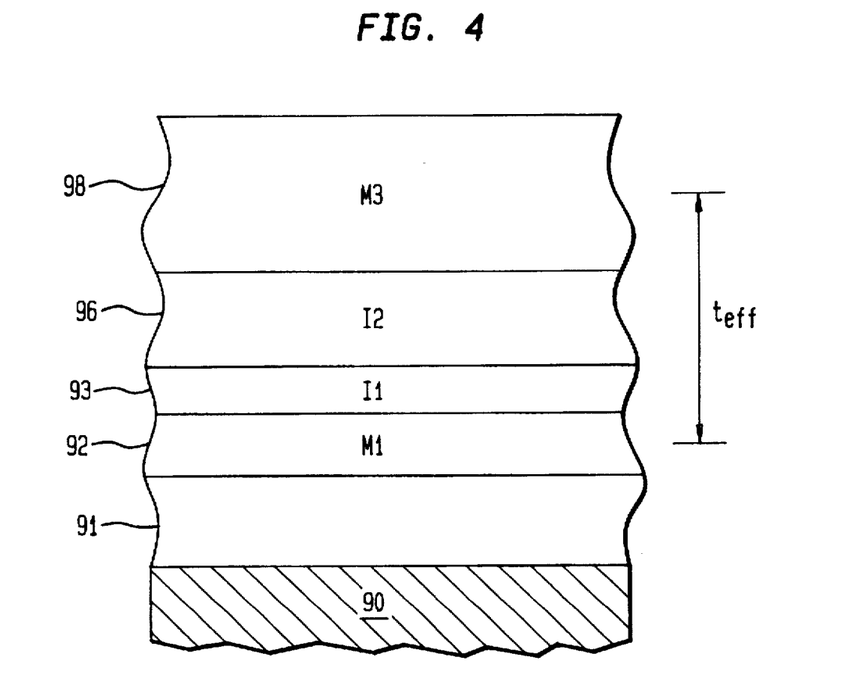
FIG. 4 is a cross-section along view X–X' of FIG. 7 of the planar solenoid of the present invention.
Figure 5:
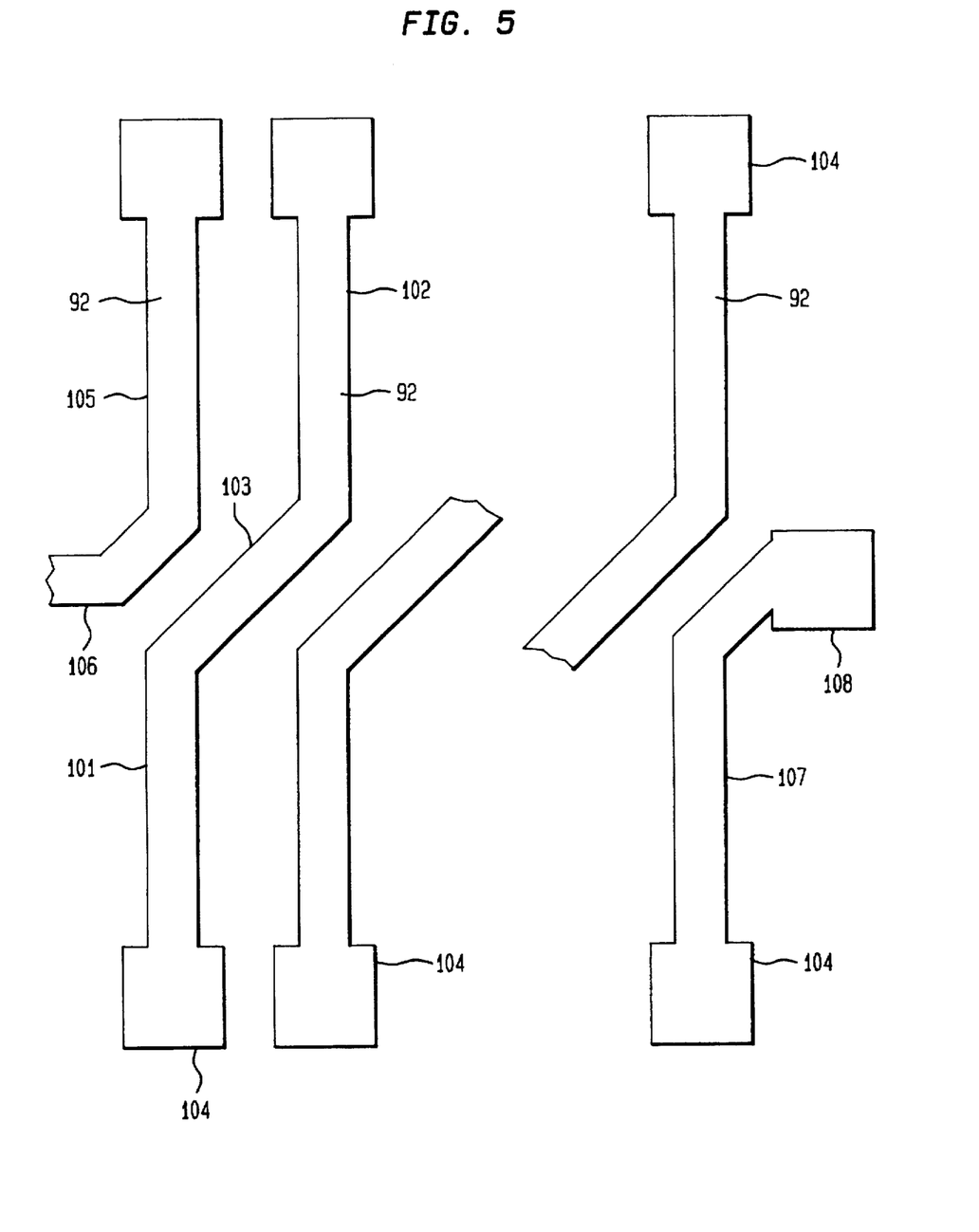
FIG. 5 is a plan view of the first patterned metal layer of the planar solenoid of the present invention.

FIGS. 4 through 8 describe the fabrication of the novel multi-turn, thin-film miniature elements 74, 76 of the present invention which have been termed planar solenoids since they are in the form of a flattened solenoid. Typically, the fabrication process begins with providing, by thermal oxidation, a layer 91 of SiO2 on a silicon substrate wafer 90. Typically layer 91 is about 3000Å in thickness. Next, using photolithographic techniques known in the art, the patterned first Niobium metal structures 92 shown in FIG. 5 are provided. Structure 92 is typically 2000Å in thickness.

The pattern of the structures of FIG. 5 are shown in the form of a dog-leg, except for the the ones at either end of the structure. The dog-leg, or intermediate structure, of FIG. 5 is characterized as having first and second segments 101, 102 parallel to each other but offset from each other and connected by a third segment 103. The opposite ends of the dog-leg structure terminate in end pads 104, here shown square. The first end piece or connection 105 is similar to the second segment 102 except it terminates in an extension piece 106 which becomes transmission line 79, for example. The second end piece or connection 107 is similar to first segment 101 except it terminates in pad 108. The pattern of the segments 101, 102, 103, and 104 may be repeated as required depending upon the number of "turns" the planar solenoid is to have.

Figure 6:
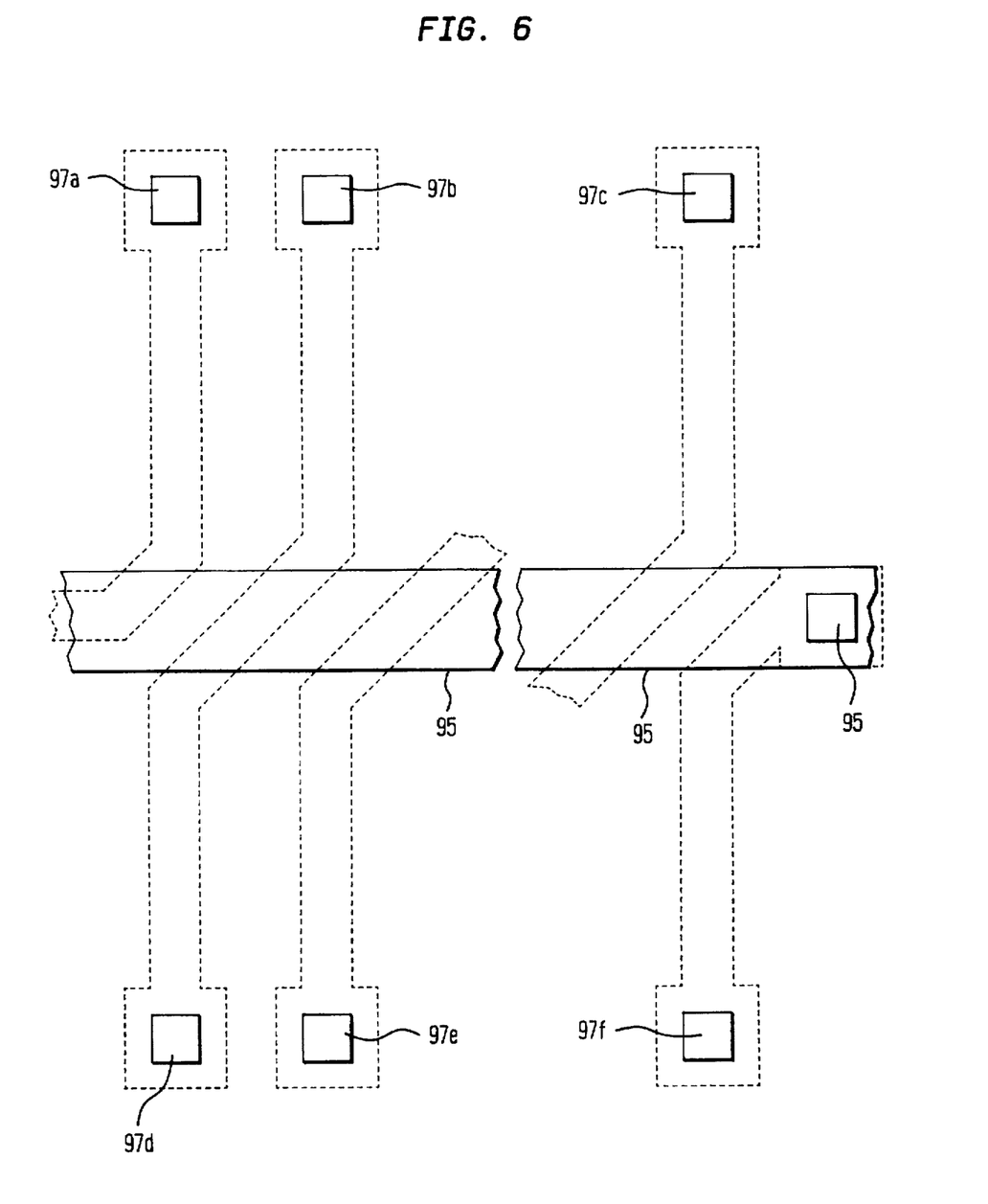
FIG. 6 is a plan view of the second patterned metal layer of the planar solenoid of the present invention.

Next, a layer 93 of $SiO_2$ of typical thickness of about 5000Å is sputtered onto the surface. This is the first insulating layer. Layer 93 is then planarized using techniques known in the art reducing its thickness to about 1500Å above layer 92 at the end of the planarization process. Next, a via is etched through layer 93 at location 94 to expose metal 92 at the bottom thereof. Thereafter, again using photolithographic techniques, a second layer of Niobium metal about 2000Å thick is patterned onto the surface of layer 93 to form line 95 as shown in FIG. 6. At location 94, metal layer 95 will be in contact with metal layer 92. A layer 96 of quartz ($SiO_2$) about 3000Å in thickness is next sputtered over the surface to cover the surface of layer 93 and conformally cover layer 95. vias are next etched through insulating layers 93 and 96 at locations 97a–f thereby exposing first metal layer 92 at the bottoms thereof as is also shown in FIG. 6.

Figure 7:
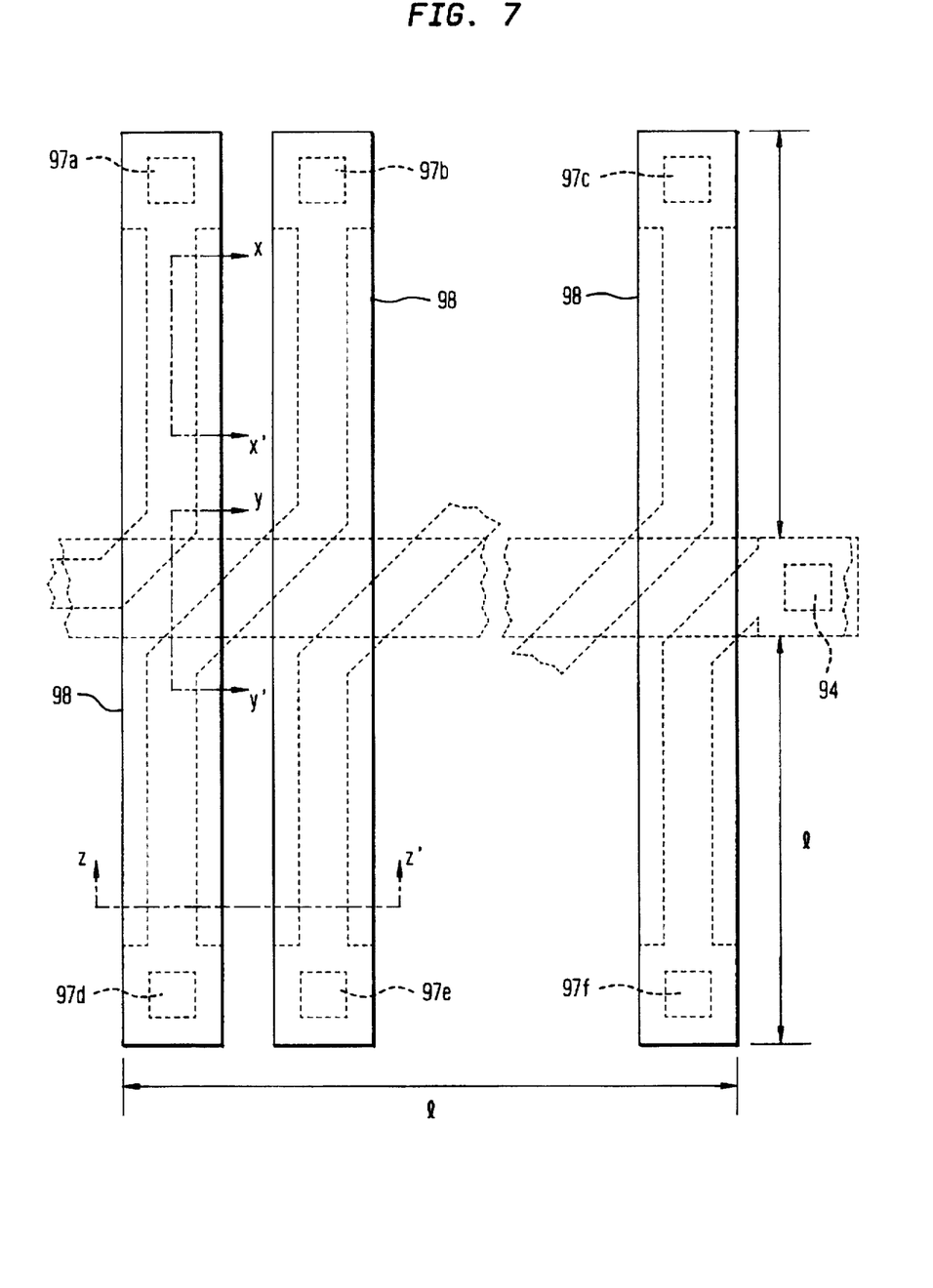
FIG. 7 is a plan view of the planar solenoid of the present invention following deposition of the third patterned metal layer.

Lastly, and again using photolithographic techniques, a third patterned layer of Niobium 98 about 5000Å in thickness is formed on second quartz insulating layer 96 as shown in FIG. 7. Layer 98 is in electrical contact with layer 92 at vias 97 a–f and, moreover, there is established the novel spiral conductive path of the planar solenoids of the present invention from, for example, metal 92 at the bottom of via 97a up to metal 98 at the top of via 97a and across to the top of via 97d down to metal 92 at the bottom of via 97d and over and across to the bottom of via 97b through metal 92 of segments 101, 102, and 103.

More specifically, for a two-turn planar solenoid, there exists an electrical path from extension 106, through end piece 105, up via 97a to the first segment of third metal layer 98, across that segment, down through via 97d, then across segments 101, 103, and 102 of first metal layer 92 and then up via 97b, across the second segment of third metal layer 98, down via 97e, across the second dog-leg segment of metal layer 92, up via 97c, across the third segment of third metal layer 98, then down via 97f to second end connection 107 to pad 108, then up through via 94 to electrically connect with second metal layer 95 which traverses the longitudinal axis of the planar solenoid to electrically communicate with transmission line 80.

It will be appreciated by those skilled in the art that provisions may be made to integrate the fabrication of pickup element 72, lines 79, 80 and the SQUID apparatus of areas 78, 81 and 82 and pads 83, 84 and 85 and their associated electrical interconnect lines (shown in exemplary fashion as line 100 in FIG. 2) during the formation of planar solenoids 72, 74. Such fabrication is generally referred to as 3-level of metal Josephson technology which may, for example, be an extension of the 2-level process described in the article in Appl. Phys. Lett., 59 (20), November 1991, by Ketchen, et al., which article is herein incorporated by reference.

Figure 8:
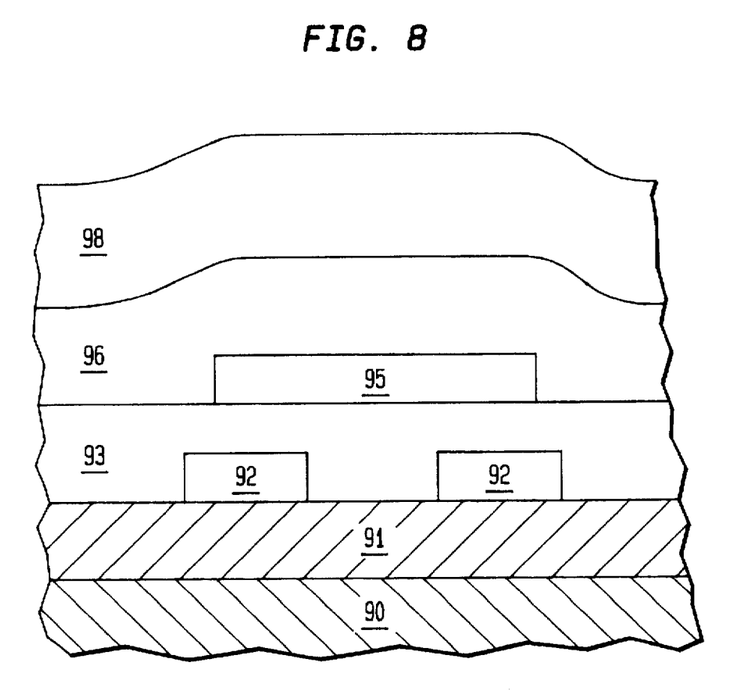
FIG. 8 is a cross-section along view Y–Y' of FIG. 7 of the planar solenoid of the present invention.

As will be seen, FIG. 4 is a cross-section of the layered structure of a planar solenoid taken at X–X' shown on FIG. 7. FIG. 8 is a cross-section of the planar solenoid taken at Y–Y' as also shown in FIG. 7.

Figure 9:
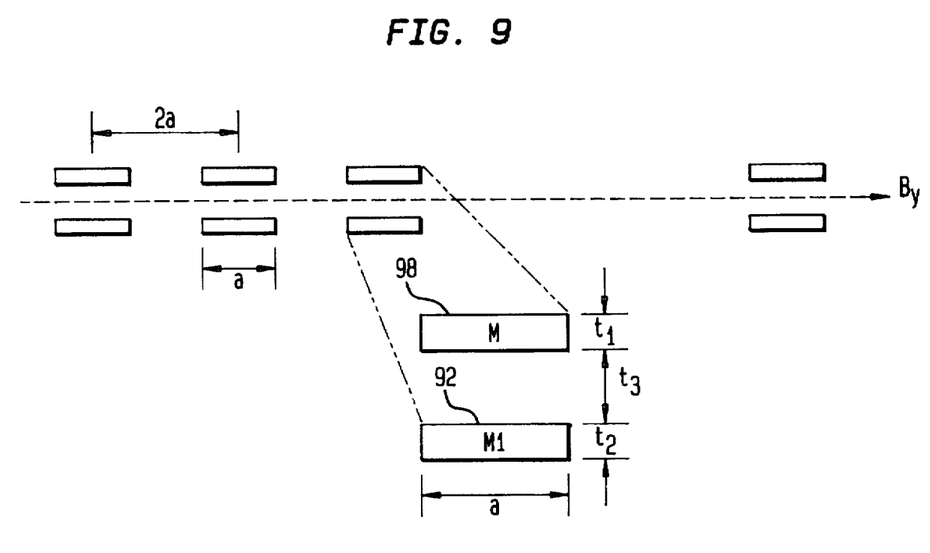
FIG. 9 is a cross-section along view Z–Z' of FIG. 7 of the planar solenoid of the present invention.

A side-view of the planar solenoid pickup element of this invention is shown in FIG. 9 in cross-section along section Z–Z' of FIG. 9. In FIG. 9, M1 and M3 are assumed to be of the same width a. There are $$n = \frac{1}{2a}$$

pickup loops in series, each sensitive to $B_y$ with a pickup area of $$\left( \frac{t_1 + t_2}{2} + t_3 \right) 1.$$

Thus the total pickup area is $$A = n \left( \frac{t_1 + t_2}{2} + t_3 \right) 1 = \left( \frac{t_1 + t_2}{2} + t_3 \right) \frac{1^2}{2a}.$$

The inductance of this structure is given by $$L = n \left[ \mu_0 \left( \frac{2\lambda + t_3}{a} \right) n 1 \right] = n \left[ \mu_0 \left( \frac{2\lambda + t_3}{a} \right) \frac{1^2}{2a} \right]$$

where n=1 in the limit of a<<($t_3+2\lambda$) and n=½ is the limit of a>>($t_3+2\lambda$). As an example, consider the case of l=10 µm, a=0.5 µm and $$\left(\frac{t_1+t_2}{2}+t_3\right)=(2\lambda+t_3)=0.5\,\mu m.$$

Thus, A=50 µm², or a full half of the 10×10 µm² surface area occupied by the active pickup loop structure. The inductance is L≈100 pH which is about the maximum advisable for a typical 100–150 pH SQUID design. For a single conventional pickup element A $\alpha$ $l^2$ while L $\alpha$ 1. Thus as l increases the design of the present invention with L $\alpha$ $l^2$ becomes less favorable. However, for 1≦10 µm, which is the size of interest for the microscope, the design of the present invention is ideal and allows integration of the 3-axis magnetometer on a single planar substrate.

The planar solenoid design of the present invention is relatively insensitive to the magnetic field component perpendicular to the plane of the substrate ($B_z$). Sensitivity to Bz will be dominated by any misalignment δ of M1 with respect to M2. This will present a pickup area of order (δ/a)/A where δ can be held to ≦0.05 µm using modern e-beam lithography alignment techniques. Sensitivity to $B_z$ arises from both direct coupling of the applied $B_z$ to the elements and from similar coupling to a component of $B_x$ arising from distortion of flux applied to the groundplane structure. Lack of perfect orthogonality between the three axes can be easily compensated for in subsequent digital data analysis assuming a calibration is done to precisely determine the sensitivity of each magnetometer to $B_x$, $B_y$, and $B_z$. The planar solenoids of the invention should be scalable down to at least ~2 µm (with n=2 for a=0.5 µm).

Devices other than the three-axis magnetometer may be made advantageously with the use of the planar solenoids. For example, two such planar solenoids could be configured as a gradiometer thereby achieving on a flat substrate a device sensitive, for example, to $\partial B_z/\partial x$. In this case, as is explained in more detail in the paper by M. B. Ketchen in J. Appl. Phys. 58 (11), Dec. 1 1985 and in U.S. Pat. No. 5,122,744 to R. H. Koch, which are herein incorporated by reference, the planar solenoid pickup elements would be connected in opposition and then either connected to a read out device or form part of the read out device.

Further, a magnetic detector sensitive to higher order spacial derivatives of the in-plane magnetic field can be obtained by an extension of the first derivative concept discussed above. For example, the pickup elements of two such gradiometers sensitive to $\partial B_z/\partial x$ can be connected in opposition and then either connected to a read out device or form part of the read out device to give a planar detector sensitive to $\partial^2 B_z/\partial x \partial y$.

Yet further, a magnetic sensor independently sensitive to magnetic fields and a plurality of spacial derivatives thereof can be obtained by the use of a plurality of detectors. Use of the novel planar solenoids of the invention in one or more of the detectors of such a sensor enables such a magnetic sensor with all its detectors and other components to be integrated (situated) on a single planar substrate and to measure a broader set of field components and spatial derivatives than can be measured using pickup elements of conventional configuration alone.

It will also be appreciated by those skilled in the art that modifications of this invention may be practiced without departing from the essential scope of this invention, for example, that the structures of first metal layer 92 need not necessarily be in the form of the dog-legs shown nor that electrical communication between metallic layers need necessarily be accomplished by the illustrative vias and that other high and low Tc superconducting materials may be substituted for Niobium which is used in the embodiment described herein.

We claim:

1. An integrated three-axis SQUID magnetometer comprising:

a substrate;

three planar SQUIDS each having at least one Josephson element situated on a first region of said substrate;

three pickup elements formed at a second region of said substrate, each associated with one of said SQUIDS, two of said pickup elements being of a planar solenoid form and the third being of a planar element form having at least one loop.

2. The magnetometer of claim 1 wherein said pickup elements are inductively coupled to said SQUIDS.

3. The magnetometer of claim 1 wherein said pickup elements are directly coupled to said SQUIDS.

4. The magnetometer of claim 1 wherein said pickup elements form part of the inductive loop of the SQUID.

5. An integrated three-axis magnetometer comprising:

a flat substrate;

three detection devices mounted at a second region on said substrate;

three pickup elements located at a first region of said substrate, each connected to one of said detection devices, two of said pickup elements being of a planar solenoid form and the third being of a planar element form having at least one loop.

6. A planar solenoid comprising:

a first patterned layer of metal located on a substrate, said first layer comprising a first end connection, one or more intermediate segments and a second end connection;

a first insulating layer over and contiguous with said first layer of metal;

a second patterned layer of metal on said first insulating layer;

a second insulating layer over and contiguous with said first insulating layer and over, contiguous with and conformal to said second layer of metal;

a third patterned layer of metal over said second insulating layer;

and further including vias whereby an electrical path exists between said first end connection, the first segment of said third metal layer, at least a first segment of said first metal layer, the second end connection which end connection is electrically connected to said second metal layer.

\* \* \* \* \*